United States Patent [19]
Smith

[11] Patent Number: 6,127,730
[45] Date of Patent: Oct. 3, 2000

[54] COMPOSITE METAL FILMS FOR SEVERE TOPOLOGY INTERCONNECTS

[75] Inventor: Gregory C. Smith, Garland, Tex.

[73] Assignee: Texas Instruments Incorporated, Dallas, Tex.

[21] Appl. No.: 08/026,918

[22] Filed: Mar. 5, 1993

Related U.S. Application Data

[62] Division of application No. 07/888,777, May 26, 1992, Pat. No. 5,231,055.
[51] Int. Cl.$^7$ ............................ H01L 23/48; H01L 23/52; H01L 29/40
[52] U.S. Cl. ............................................. 257/750; 257/763
[58] Field of Search ....................... 257/739, 752, 257/760, 763, 764, 750; 437/192

[56] References Cited

U.S. PATENT DOCUMENTS

| | | | |
|---|---|---|---|
| 4,674,176 | 6/1987 | Tuckerman | 257/752 |
| 4,795,722 | 1/1989 | Welch et al. | 257/752 |
| 4,816,126 | 3/1989 | Kamoshida et al. | 204/192.3 |
| 4,822,753 | 4/1989 | Pintchovski et al. | 257/760 |
| 5,183,782 | 2/1993 | Onishi et al. | 437/192 |

OTHER PUBLICATIONS

Mehta, et al.; "Blanket CVD Tungsten Interconnect for VLSI Devices", *Proceedings Third International IEEE VLSI Multilevel Interconnection Conference*, pp. 418–435, Jun. 9–10, 1986.

Rosler, et al.; "Tungsten chemical vapor deposition characteristics using SiH4 in a single wafer system", *J. Vac. Sci. Technol.*, pp. 1721–1727, B 6(6), Nov./Dec. 1988.

*Primary Examiner*—Mahshid Saadat
*Assistant Examiner*—S. V. Clark
*Attorney, Agent, or Firm*—Carlton H. Hoel; W. James Brady; Richard L. Donaldson

[57] ABSTRACT

A process for forming a smooth conformal refractory metal film on an insulating layer having a via formed therein. This process provides extremely good planarity and step coverage when used to form contacts in semiconductor circuits and, in addition, offers improved wafer alignment capability as well as enhanced reliability which result from the smooth surface morphology. The process includes forming contact openings through an insulating layer to a semiconductor substrate; depositing a first blanket layer of titanium using deposition conditions that provide a conformal film that exhibits good step coverage at the contact opening; and forming a second blanket layer of titanium using deposition conditions that provide reduced surface asperity height. The process is ideally suited to forming an electrical interconnection system for semiconductor integrated circuit devices such as static or dynamic random access memories and is particularly useful in VLSI devices that incorporate multiple levels of interconnect.

10 Claims, 2 Drawing Sheets

COMPOSITE METAL FILMS FOR SEVERE TOPOLOGY INTERCONNECTS

This is a division of application Ser. No. 07/888,777, filed May 26, 1992, now U.S. Pat. No. 5,231,055.

BACKGROUND OF THE INVENTION

The present invention relates to electronic semiconductor devices and methods of fabrication, and more specifically, to very large scale integrated circuits which may incorporate multiple levels of interconnect.

Interconnect and contact system technology are increasingly a focus of attention as the demands of VLSI circuit development require smaller contact dimensions and multiple levels of finely patterned electrical conductors. In particular, the use of multiple layers of interconnect has placed great demands on improving processing technology related to the etching of contact vias and the planarization of interlevel insulators to ensure adequate coverage of severe changes in device topology. In processes that continue to employ aluminum-based metal interconnect, the contact vias may be filled with a selectively deposited metal such as tungsten to reduce the contact step coverage problems that have been observed in the past. See, for example, Broadbent, E. K. et al, J. Electrochem. Soc., Vol. 131, p. 1427 (1984).

More recently, blanket chemical vapor deposited (CVD) tungsten has been investigated as an alternative interconnect metallization for VLSI application. See "Blanket CVD Tungsten Interconnect For VLSI Devices", Sunil Mehta et al, 1986 V-MIC Conf., Jun. 9–10, pp. 418–435. As reported by the above authors, tungsten interconnect offers significant advantages over aluminum based systems. For example, tungsten affords a marked improvement in electromigration resistance. Moreover, CVD tungsten may be processed to produce a very conformal film which has greatly improved step coverage thereby minimizing the previous restraints presented by severe steps in the underlying topology. In addition, tungsten withstands higher processing temperatures than aluminum making it suitable for use in processes that employ high temperature operations (such as insulator reflow) after tungsten deposition.

A preferred deposition chemistry for low pressure chemical vapor deposition (LPCVD) of tungsten films in VLSI processes involves the hydrogen reduction of WF6. See, for example, "Low Pressure Chemical Vapor Deposition of Tungsten and Aluminum for VLSI Applications", R. A. Levy et al., Journal of Electrochemical Society, February, 1987, pp. 37C–49C. As previously reported, the reduction reaction is rate limited by the disassociation of H2 into atomic hydrogen at the reaction surface. As a result, the deposition temperature may be chosen to selectively deposit on silicon only or to deposit on both silicon and insulator (for example SiO2). At temperatures below about 500 degrees C. the insulator will not catalyze the H2 disassociation but a silicon surface will. This makes possible the selective deposition of tungsten in contact vias for the purpose of providing plugs to aid in reducing severe steps for later metallization processes as mentioned previously. At higher temperatures, tungsten films will deposit on both silicon and insulator surfaces making a suitable VLSI interconnect film.

While CVD tungsten deposition using the hydrogen reduction of WF6 may be performed in such a way as to result in extremely conformal films, the resulting significant surface roughness presents a variety of problems. FIG. 1 depicts a representative cross section of a typical contact to diffusion 12 in a semiconductor substrate 10. The via formed in insulator 14 is very conformally covered by tungsten film 16 as shown by the slight deviation from surface planarity at region 19. Typical of such a conformal film are the very large surface asperities or protrusions 18. That is, the height of localized peaks of material at the surface (asperity height) is greater for deposition conditions that result in very conformal films. Similar vias in insulating layers are used on semiconductor wafers to provide alignment markers to permit automated alignment during processing. These markers may be detected by exposing the surface to a light source and detecting the reflected signal. One problem created by excessive tungsten surface roughness is the inability to pattern thick layers because a reduced signal to noise ratio prevents the detectors on the alignment device from finding the alignment markers. In addition, the etch chemistry typically used to etch the tungsten is not selective to oxide. As a result of the tungsten surface roughness, pitting of the underlying insulator (14) may result during the anisotropic etching of the tungsten film. Yet another disadvantage of the rough conformal film of FIG. 1 is that asperities 18 present points of increased electric field to an upper level conductor separated from film 16 by an overlying insulator (not shown). Finally, the recesses in the surface of film 16 may provide regions of voiding during the formation of an overlying insulator which in turn may present reliability problems.

While the CVD tungsten deposition conditions may be modified to provide smoother tungsten films with acceptable resistivity, the conformality is poor.

Accordingly, it is an object of the present invention to provide a new and improved process for forming a metallic film suitable for use as interconnect in very large scale integrated circuits. It is a further object of the invention to provide a process for forming a very conformal metallic film having reduced surface roughness. Yet another object of the invention is to provide a process for forming a conformal blanket tungsten film on the surface of an insulating layer. Still a further object of the present invention is to provide a conformal metallic film having reduced surface roughness on the surface of an insulating layer.

Still a further object of the present invention is to provide a conformal metallic film having reduced surface roughness on the surface of an insulating layer.

SUMMARY OF THE INVENTION

In accordance with one embodiment of the present invention, there is provided a process for forming a conformal metal film with smooth surface morphology on an insulator having a contact via formed therein. The process comprises the steps of providing a semiconductor substrate having an insulator on the surface and a via formed in the insulator, placing the substrate into a deposition chamber and depositing a first layer of metal under conditions that yield a conformal film, and thereafter depositing a second layer of metal under conditions that yield a smooth upper surface. In a preferred embodiment, the composite metallic film may then be suitably etched to form an electrically conductive element in an integrated circuit.

A process as above in accordance with the present invention may further comprise the formation of a metallic film of tungsten and the insulator may be comprised of silicon dioxide or a phosphosilicate glass (PSG). In addition, the process may further comprise the step of forming a thin barrier layer over the insulator and in the contact via to prevent interaction with the semiconductor material.

DETAILED DESCRIPTION OF THE DRAWINGS

Referring to FIGS. 2–5 a preferred embodiment of the present invention will be described. It should be noted that while the following description will use the formation of metallic interconnect and contact to the source or drain region of an MOS transistor, the process is suitable for use in a variety of integrated circuit technologies. Moreover, the process is not limited to its use as a first and/or second metal layer which form contacts but may find advantageous application in other levels of device structure where a conductive layer must be formed over nonplanar surface topology.

Figure 1:
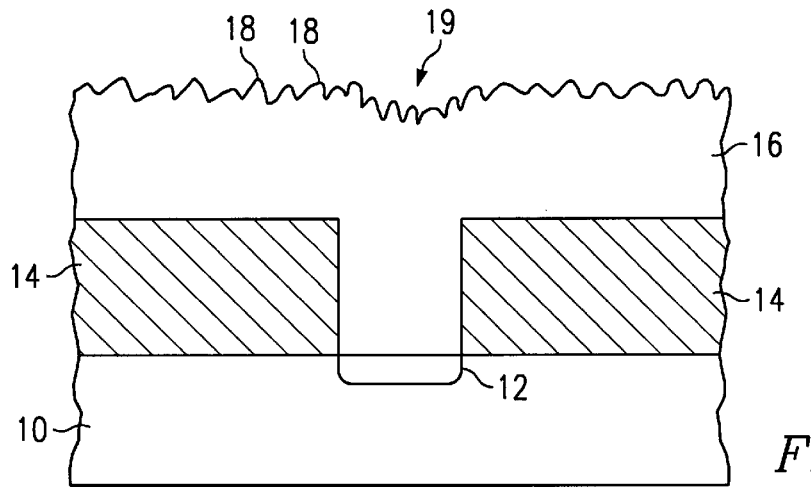
FIG. 1 is a crossectional view of a conformal metallic film having a rough surface morphology overlying an insulating layer having a contact via formed therein.
Figure 2:
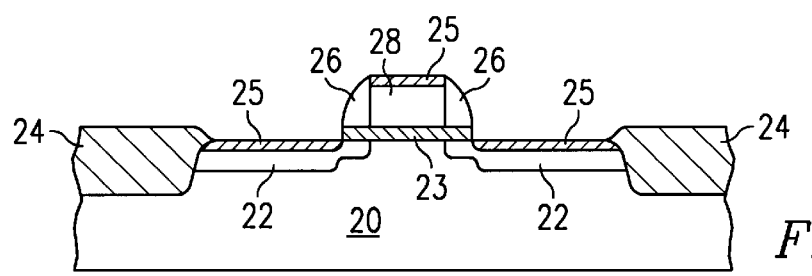
FIGS. 2 through 5 show crossectional views of a preferred embodiment of the process as used in forming interconnect metallization which contacts the source or drain of an MOS transistor.

With reference first to FIG. 2, there is shown an MOS transistor formed in the surface of a semiconductor substrate. This device is similar to the transistor shown in U.S. Pat. No. 4,746,219 and assigned to Texas Instruments Incorporated which is hereby incorporated by reference. The structure is also disclosed in copending application Ser. No. 07/291,724 filed Dec. 28, 1988 in the name of Ted Houston et a entitled "Memory Cell With Guard Region for Reducing Soft Error Rate" and assigned to Texas Instruments Incorporated. The structure of FIG. 2 includes a semiconductor substrate 20 having source and drain regions 22 formed therein. Each region 22 is self aligned to one side of a polysilicon gate electrode 28 which overlies a thin gate dielectric 23. Sidewall oxide spacers 26 may be formed on the sides of gate electrode 28 to permit the formation of a shallow or lightly doped drain portion of source and drain regions 22 during source/drain implant as shown. Also shown are silicide regions 25 which cover the upper surface portions of source and drain regions 22 as well as gate electrode 22. This may be accomplished by, for example, depositing a layer of titanium and forming the regions 25 by reacting the structure in a high temperature nitrogen ambient. Silicide regions 25 serve to decrease the resistivity of regions 22 and electrode 25 which enhances the electrical performance of the final integrated circuit. The transistor structure is isolated by field isolation regions 24 which are formed in the substrate 20 using well known LOCOS (local oxidation of silicon) techniques. Of course other well known isolation techniques would be appropriate.

Figure 3:
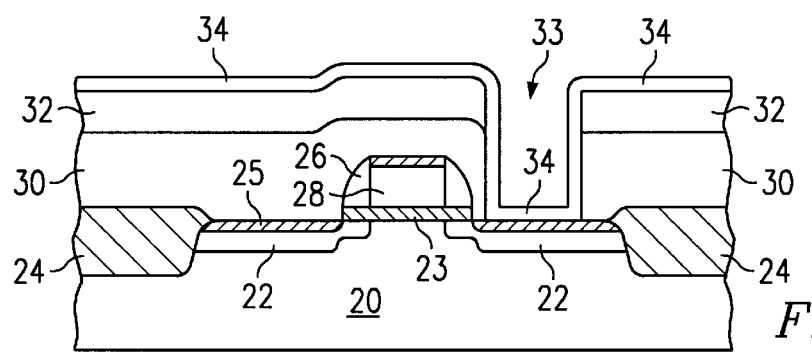

Referring next to FIG. 3, the process proceeds by forming insulating layer 30 over the surface of the structure using well known techniques. For example, layer 30 may be formed by low pressure chemical vapor deposition (LPCVD) of oxide to a thickness of about 1 micron and thereafter planarizing the structure using known resist etchback methods to provide a smooth surface topography. That is, after the oxide is deposited the surface is coated with photoresist. The resist profile is then etched back into the oxide to reduce steps caused by uneven underlying topography. Still referring to FIG. 3, the process continues by depositing a layer of phosphosilicate glass (PSG) 32 to a thickness of, for example, 0.3 microns. This PSG layer is a phosphorus doped oxide that, when treated at elevated temperature, reflows to further smooth the surface contour as is well known. A suitable condition for the present process is about 800 degrees C. for 15 minutes in a nitrogren ambient. The structure is next patterned and selectively plasma etched to form contact vias where desired. One contact via 33 to either the source or drain region is shown in FIG. 3. Following contact etch, a thin layer of titanium-:tungsten (TiW) 34 is deposited to a thickness of approximately 0.05 microns. Ideally, this layer is formed to be as thin as possible yet thick enough to remain a nucleated layer. This layer will cover both PSG layer 32 and silicided surface regions 25 and serves to provide a barrier to prevent a silicon reduction reaction and possible erosiom of the contact surface during the subsequent deposition of tungsten. While a multilayer insulator process has been described to this point, any well known methods of forming insulators on semiconductors will be suitable.

Figure 4:
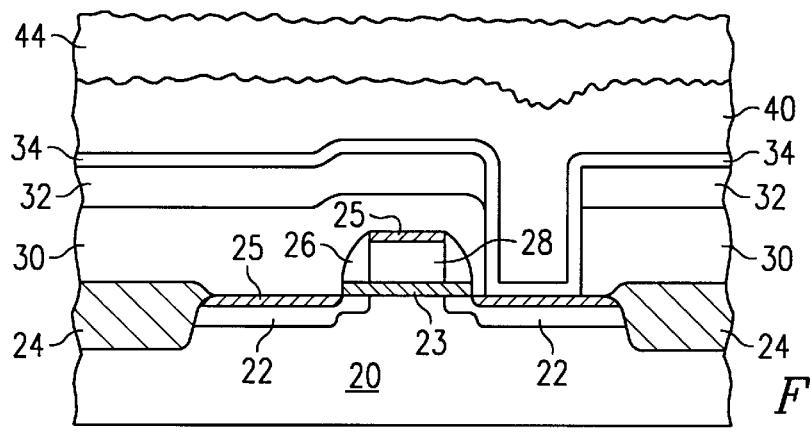

Referring next to FIG. 4, a first blanket layer of CVD tungsten 40 is deposited. The processing conditions for this deposition step are chosen so that a very conformal film having about half the total thickness of the final composite tungsten layer is provided. Generally, this total thickness perpendicular to the underlaying insulating surface should be at least about half as great as the diameter of the largest contact via to be filled. In the present embodiment, the diameter of contact via 33 is, for example, 0.8 microns. As shown, appropriate conditions result in the underlying contact 33 being completely filled without voiding by conformal layer 40. In the preferred embodiment, layer 40 is deposited by the hydrogen reduction of WF6 using gas flow rates of about 20 sccm for WF6 and 80 sccm for H2. The deposition chamber conditions are maintained at a pressure of approximately 1 torr and a temperature of about 570 degrees C. These conditions will provide a tungsten deposition rate of about 0.2 microns per minute and an extremely conformal film having a surface asperity height that is proportional to the film thickness. The thickness of layer 40 is chosen to be about 0.5 microns for a contact size of about 1.0 micron.

Still referring to FIG. 4, a second blanket layer of CVD tungsten 44 is deposited to provide the second half of the composite film. The processing conditions for this deposition step are chosen so that a film having the desired smooth surface morphology results. Since the contact via 33 (FIG. 3) has been uniformly filled by layer 40, it is not necessary that the conditions for the deposition of layer 44 provide good conformality. In addition to the smooth surface characteristics, the layer 44 should have a bulk resistivity about equivalent to that of layer 40. In the preferred embodiment, layer 44 is deposited by the hydrogen reduction of WF6 using gas flow rates of about 5 sccm for WF6 and 95 sccm for H2. Again, the deposition chamber conditions for this operation are chosen to include a pressure of approximately 1 torr and a temperature of about 570 degrees C. These conditions will provide a tungsten deposition rate of about 0.2 microns per minute. The final desired thickness is accomplished by depositing layer 44 to a thickness of about 0.5 microns. Using the above conditions, a relatively smooth upper surface results as shown. As can be appreciated, the composite metal film has a much smoother surface than it would if a one step conformal process had been used since the surface asperity height is proportional to the thickness of the conformal part of the deposition. The composite film may next be suitable patterned and etched using standard tungsten etching procedure to provide the desired metal interconnect pattern.

Figure 5:
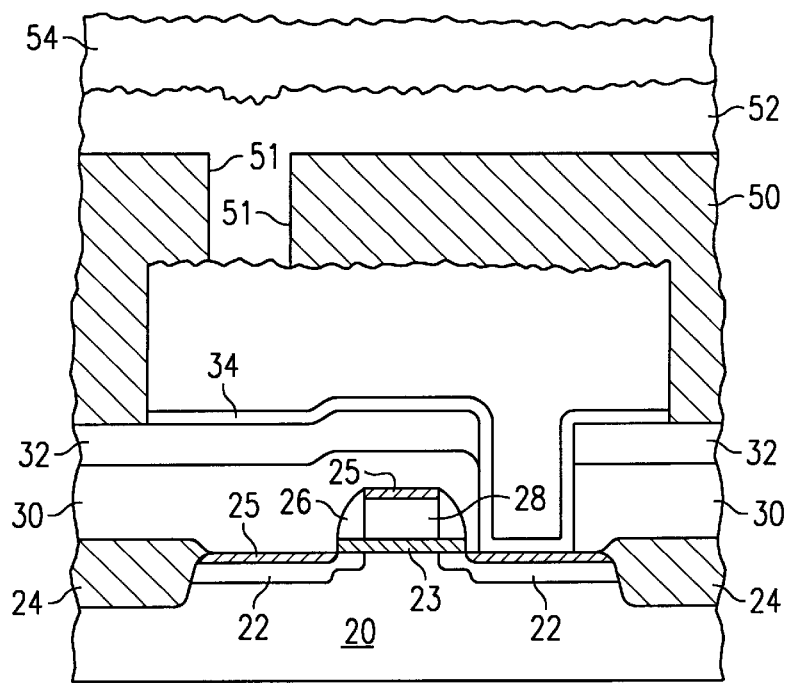

Turning now to FIG. 5, the structure is shown after second level metallization process. As mentioned above, the blanket composite deposition process of the present invention is suitable for multiple levels of interconnect. As shown in FIG. 5, the process may continue by depositing an insulating layer 50 over composite CVD film 48 which may be planarized using the resist etchback technique previously described. Layer 50 may have a final thickness of, for example 0.8 to 1.0 micron. A via 51 is etched in layer 50 to provide a contact window to composite layer 48. The process now continues by the deposition or conformal tungsten layer 52 using the conditions used for the deposition of layer 40 followed by the deposition of tungsten layer 54 using the conditions used for the deposition of layer 44. Again, each layer 52 and 54 will have about half the thickness of the total composite film which will be chosen to be at least as great as the diameter of contact 51. As before, the composite film comprising layers 52 and 54 may next be patterned and etched using standard techniques to provide a second level interconnect pattern. The result of the second two step tungsten deposition process is a second level metal interconnect with excellent conformal coverage of contact vias and an improved smooth surface. Obviously, other structures, including additional levels of composite tungsten interconnect may be envisioned.

The preferred method of obtaining the two levels of CVD tungsten each having the desired characteristics is to maintain a constant deposition temperature and pressure for each of the two steps. As described above, the temperature for both tungsten deposition steps remained the same (570 degrees C.). The ratio of the two gases (WF6 and H2) was changed in going from the first deposition step (layer 40) to the second (layer 44).

Figure 6:
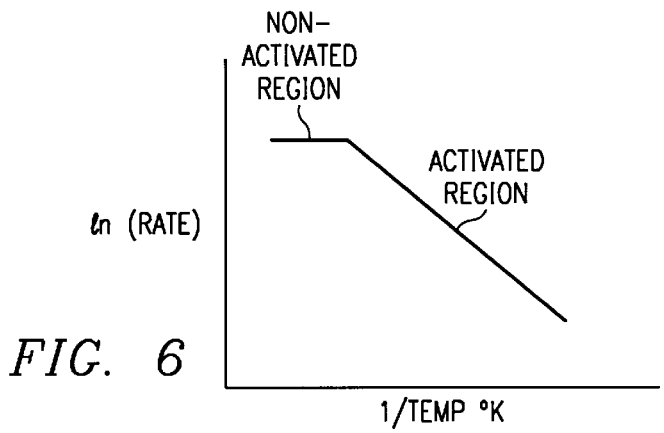
FIG. 6 depicts an Arrhenius plot showing in general the activation regimes of metal film deposition rate as a function of temperature for given deposition conditions.

With reference to FIG. 6, there is shown a typical Arrhenius plot which is used to depict the temperature dependence of deposition rate. Here we refer to the relationship of ln (deposition rate) as a function of the reciprocal of temperature in degrees Kelvin as expressed by the equation: R(rate)= $R(0)e^{-Q/kT}$. R(0) is a constant that is dependent on the partial pressures of the gasses WF6 and H2. As shown, there are essentially two temperature regimes for the deposition process. At lower temperatures, there exists an "activated region" wherein a highly temperature dependent deposition rate is realized. The slope of the curve in the activation region is the activation energy Q of the above expression. Obviously, the higher the activation energy, the more dependent the deposition rate is on temperature. In the activated regime the deposition proceeds under conditions where the surface being deposited is not starved for reactants. As temperature increases sufficiently, the deposition rate becomes almost independent of temperature. This regime is shown as the "non-activated region" of FIG. 6. In the non-activated regime the activation curve flattens as the reaction at the surface becomes limited by the feed rate of the reactants.

Figure 7:
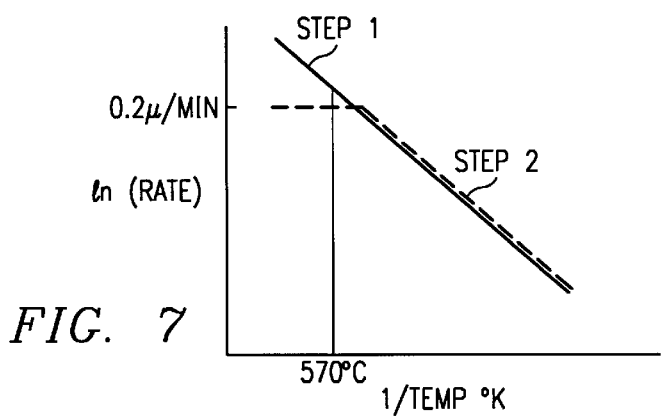
FIG. 7 depicts an Arrhenius plot showing the deposition rate versus temperature for the deposition conditions used in forming the composite metal film of the preferred embodiment.

Turning now to FIG. 7, there is shown an Arrhenius plot of the two step blanket tungsten deposition process of the preferred embodiment. The first conformal layer 40 is deposited in step 1 under conditions that provide an "activated region" or highly temperature dependent deposition rate. These conditions are shown as the solid line "step 1" of FIG. 7. The second surface layer 44 is deposited under conditions that provide the relatively flat "non-activated region" temperature dependence. It can be seen that changing the gas flow rates changes the nature of the Arrhenius plot (temperature dependence of deposition rate) and it is possible to select conditions that include a temperature (in this case 570 degrees C.) that is above that required to enter the non-activated regime for the gas flow rates of step 2 and sufficient to remain in an activated regime for the gas flow rates of step 1. Since modifying gas flow rates is more controllable than varying temperature, it is desirable to choose a temperature suitable for both deposition steps (layer 40 and layer 44) and vary only gas flow conditions as described.

The composite CVD tungsten film that results from the two step deposition process of the preferred embodiment provides a number of distinct advantages when used in VLSI process flows. As mentioned previously, reliable wafer alignment marker detection requires recognition of vias in insulating layers underlying metallization layers. These vias may be on the order of 1–1.4 microns in depth and when covered with a conformal CVD tungsten film having a rough surface contour, detection is difficult. The process described herein provides both excellent conformality and hence contact coverage while retaining a sufficiently smooth surface to dramatically improve the signal to noise ratio of alignment marker detection equipment. Additionally, the smoother surface results in decreased potential for etching cavities or pits in the insulators that may underlie the CVD composite layer since an anisotropic tungsten etch (which may have little selectivity to oxide) will more uniformly approach the CVD/insulator surface. Moreover, the improved CVD tungsten surface minimizes the chance of forming voids in the surface contour recesses as additional layers of overlying insulation are formed. Finally, by reducing asperity height at the surface, the potential for interlevel dielectric breakdown resulting from localized electric fields is minimized.

Although the invention has been described in detail herein with reference to its preferred embodiment and certain described alternatives, it is to be further understood that numerous changes in the details of the embodiments of the invention will be apparent to, and may be made by, persons of ordinary skill in the art having reference to this description. It is contemplated that all such changes and additional embodiments are within the spirit and true scope of the invention as claimed below.

We claim:

1. A conductor comprising:

a first conductive layer having a first surface asperity; and a second conductive layer formed on said first conductive layer and having a surface asperity which is less than said first surface asperity.

2. A conductor as recited in claim 1 wherein said first and second conductive layers comprise tungsten.

3. A conductor as recited in claim 1 wherein said first and second conductive layers have a thickness that is about half that of said conductor.

4. A conductor as recited in claim 1 wherein said first conductive layer is formed on a nucleating layer.

5. A conductor as recited in claim 4 wherein said nucleating layer comprises titanium tungsten.

6. A structure on a semiconductor substrate, said structure comprising:

a first insulating layer formed on said substrate and having at least one via therein;

a first conductive layer formed on said substrate and in said via, said first conductive layer conformally covering said via and having a first asperity height; and a second conductive layer formed on said first conductive layer, said second conductive layer having a substantially planer upper surface, said upper surface having a surface asperity height which is less than said first asperity height.

7. A structure as recited in claim 6 wherein said first insulating layer comprises:

a first dielectric layer over said substrate; and a second dielectric layer over said first insulating layer.

8. A structure as recited in claim 7 wherein said second dielectric layer is an oxide doped with phosphorus.

9. A structure as recited in claim 6 and further comprising:

a second insulating layer overlying said second conductive layer, said second insulating layer having a second via formed therein;

a third conductive layer overlying said second insulating layer and in said second via; and a fourth conductive layer overlying said third conductive layer.

10. A structure as recited in claim 6 wherein said first conductive layer has a thickness about at least half that of the diameter of the largest via in said first insulating layer.

* * * * *